US012734760B2

(12) United States Patent
Horst

(10) Patent No.: US 12,734,760 B2
(45) Date of Patent: Sep. 15, 2026

(54) METHODS AND SYSTEMS FOR MODELING APERTURES FOR ADDITIVE MANUFACTURING

(71) Applicant: The Boeing Company, Chicago, IL (US)

(72) Inventor: Perry T. Horst, Tacoma, WA (US)

(73) Assignee: The Boeing Company, Chicago, IL (US)

( * ) Notice: Subject to any disclaimer, the term of this patent is extended or adjusted under 35 U.S.C. 154(b) by 1067 days.

(21) Appl. No.: 17/845,659

(22) Filed: Jun. 21, 2022

(65) Prior Publication Data

US 2023/0405937 A1 Dec. 21, 2023

(51) Int. Cl.

| | |
|---|---|
| ***B29C 64/393*** | (2017.01) |
| ***B29L 7/00*** | (2006.01) |
| ***B33Y 50/02*** | (2015.01) |
| ***B33Y 80/00*** | (2015.01) |
| ***G06F 30/17*** | (2020.01) |

(52) U.S. Cl.

CPC ............ *B29C 64/393* (2017.08); *B33Y 50/02* (2014.12); *B33Y 80/00* (2014.12); *G06F 30/17* (2020.01); *B29L 2007/002* (2013.01)

(58) Field of Classification Search

CPC ....... B29C 64/393; B33Y 50/02; B33Y 80/00; G06F 30/17; B29L 2007/002; B32B 2307/10; B32B 2260/023; B64D 2033/0206; G10K 11/172

See application file for complete search history.

(56) References Cited

U.S. PATENT DOCUMENTS

| | | | | |
|---|---|---|---|---|
| 1,034,460 | A | 8/1912 | Jensen | |
| 8,628,635 | B2 * | 1/2014 | Chelin | B32B 7/14 156/219 |
| 11,235,490 | B2 * | 2/2022 | Guenster | B28B 1/001 |
| 12,005,664 | B2 * | 6/2024 | Hartmann | A43B 13/14 |
| 2020/0049074 | A1 | 2/2020 | Geertsema et al. | |
| 2020/0193592 | A1 | 6/2020 | Moon et al. | |
| 2021/0254522 | A1 | 8/2021 | Martinez et al. | |

OTHER PUBLICATIONS

Extended European Search Report prepared by the European Patent Office in application No. EP 23 16 5986.3 dated Nov. 6, 2023.

* cited by examiner

*Primary Examiner* — Courtney D Heinle
*Assistant Examiner* — Andrew Thanh Bui
(74) *Attorney, Agent, or Firm* — Yee & Associates, P.C.

(57) ABSTRACT

In an example, systems and methods for modeling apertures for additive manufacturing is disclosed. In an example, a computing device includes a processor configured to carry out operations. The operations include generating a computational model of a three-dimensional structure. The three-dimensional structure includes a first group of slats including a first plurality of slats substantially parallel to each other along a first axis and a second group of slats comprising a second plurality of slats substantially parallel to each other along a second axis, wherein the second group of slats intersects the first group of slats. The operations include outputting instructions for manufacturing a substrate in accordance with the generated computation model of the three-dimensional structure. The system includes an additive manufacturing apparatus communicatively coupled to the computing device and configured to receive the instructions and manufacture the substrate in accordance with the generated computation model of the three-dimensional structure.

20 Claims, 6 Drawing Sheets

METHODS AND SYSTEMS FOR MODELING APERTURES FOR ADDITIVE MANUFACTURING

FIELD

The present disclosure relates generally to modeling apertures for additive manufacturing, and more particularly, to generating computational models for substrates including large scale patterned apertures for additive manufacturing. In examples, such substrates can be used for acoustic panels, among other implementations.

BACKGROUND

Acoustic panels include structures that specifically designed to absorb, control and/or reflect sound. For example, acoustic panels may be utilized to reduce the noise impact of aircraft engines during takeoff, flight, and landing. Acoustic panels within an aircraft may further be utilized to reduce and/or redirect aircraft noise away from bystanders that may be proximate to an aircraft during takeoff and landing.

Presently, acoustic panels are painstakingly assembled cell by cell in order to conform each panel to the complex geometries of an aircraft. A septum is inserted into each of these cells to facilitate control, and there may be tens of thousands of septa within the acoustic panels for an aircraft. Such intensive processes for inserting septa into acoustic panels increase the expense of manufacturing an aircraft, and are therefore undesirable. Hence, designers of aircraft carefully balance concerns of comfort and cost when adding acoustic panels to an aircraft.

Therefore, it would be desirable to have a method and system that take into account at least some of the issues discussed above, as well as other possible issues.

SUMMARY

In an example, a system is described. The system comprises a computing device comprising a processor, the processor configured to carry out operations. The operations comprise generating a computational model of a three-dimensional structure. The three-dimensional structure comprises a first group of slats comprising a first plurality of slats substantially parallel to each other along a first axis and a second group of slats comprising a second plurality of slats substantially parallel to each other along a second axis. The second group of slats intersects the first group of slats such that the second axis intersects the first axis at an angle between 30 degrees and 150 degrees relative to the first axis. The operations further comprise outputting instructions for manufacturing a substrate in accordance with the generated computation model of the three-dimensional structure. The three-dimensional structure further comprises an additive manufacturing apparatus communicatively coupled to the computing device and configured to receive the instructions and manufacture the substrate in accordance with the generated computation model of the three-dimensional structure.

In another example, a method is described. The method comprises generating a computational model of a three-dimensional structure. The three-dimensional structure comprises a first group of slats comprising a first plurality of slats parallel to each other along a first axis and a second group of slats comprising a second plurality of slats parallel to each other along a second axis. The second group of slats intersects the first group of slats such that the second axis intersects the first axis at an angle between 30 degrees and 150 degrees relative to the first axis. The method also includes outputting instructions readable by an additive manufacturing apparatus for fabricating a substrate in accordance with the generated computation model of the three-dimensional structure.

In another example, a non-transitory computer-readable media is described. The non-transitory computer-readable media stores instructions executable by one or more signal processors. The instructions, when executed, cause the one or more signal processors to perform functions comprising generating a computational model of a three-dimensional structure. The three-dimensional structure comprises a first group of slats comprising a first plurality of slats parallel to each other along a first axis and a second group of slats comprising a second plurality of slats parallel to each other along a second axis. The second group of slats intersects the first group of slats such that the second axis intersects the first axis at an angle between 30 degrees and 150 degrees relative to the first axis. The instructions further comprise outputting instructions readable by an additive manufacturing apparatus for fabricating a substrate in accordance with the generated computation model of the three-dimensional structure.

The features, functions, and advantages that have been discussed can be achieved independently in various examples or may be combined in yet other examples. Further details of the examples can be seen with reference to the following description and drawings.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying drawings, wherein:

DETAILED DESCRIPTION

Figure 1:
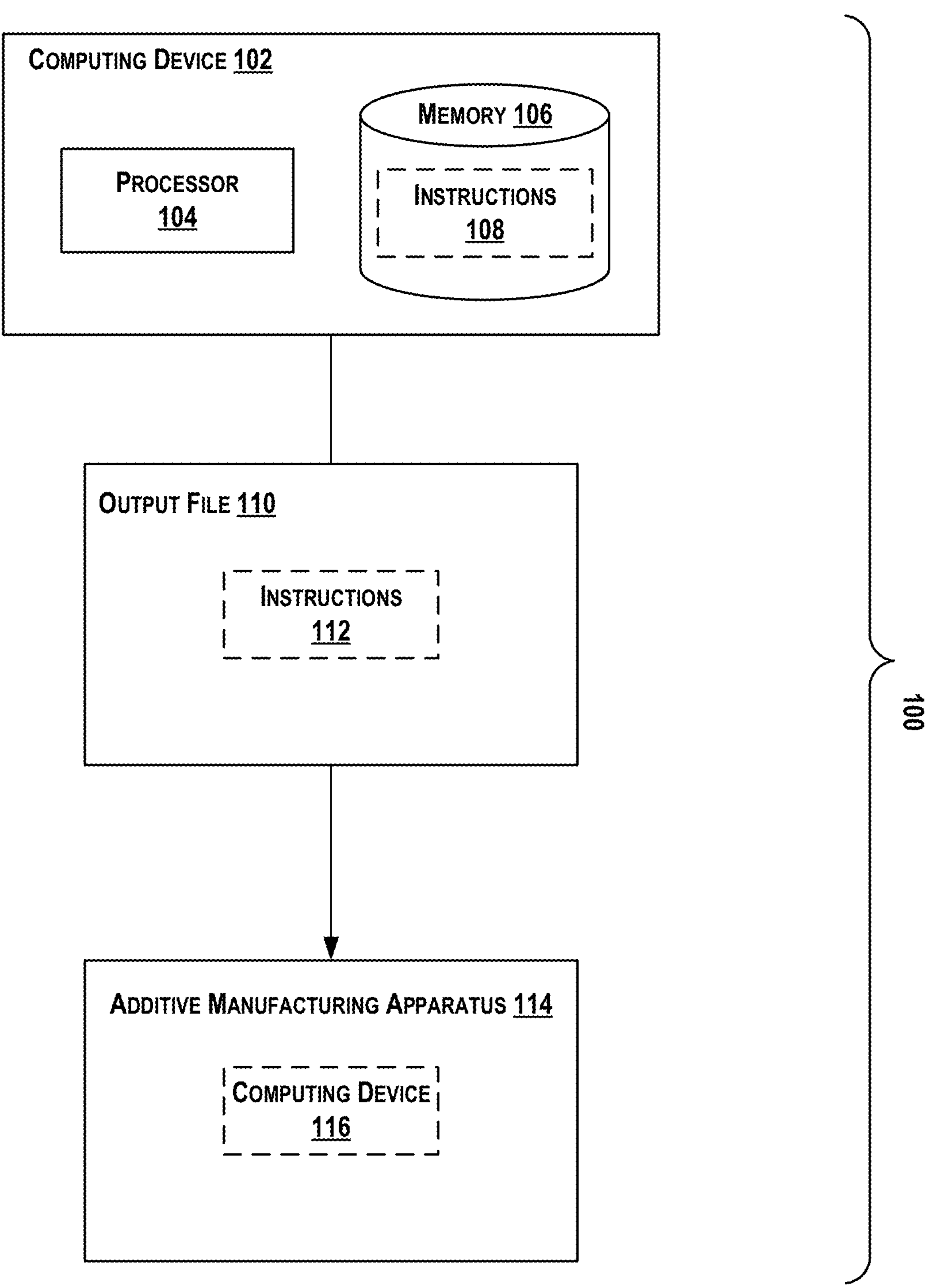
FIG. 1 depicts a computing system and additive manufacturing apparatus according to an example implementation.

Disclosed examples will now be described more fully hereinafter with reference to the accompanying drawings, in which some, but not all of the disclosed examples are shown. Indeed, several different examples may be described and should not be construed as limited to the examples set forth herein. Rather, these examples are described so that this disclosure will be thorough and complete and will fully convey the scope of the disclosure to those skilled in the art.

By the terms "substantially," "about," "approximately," and "proximate" used herein, it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Unless otherwise specifically noted, elements depicted in the drawings are not necessarily drawn to scale.

Within examples, described herein are methods and systems for modeling apertures for additive manufacturing, particularly where a computational model of a three dimensional structure is developed. The computational model is readable by an additive manufacturing apparatus, such that a substrate is formed with apertures. Namely, methods and systems of the present disclosure provide the ability to manufacture materials with small, but large-scale apertures, such as acoustic cells, without the need for perforating material and/or inserting septa.

These and other improvements are described in more detail below. Implementations described below are for purposes of example. The implementations described below, as well as other implementations, may provide other improvements as well.

The disclosed methods and systems for modeling small perforations for additive manufacturing can be used in various contexts, such as in aircrafts or other vehicles, or in environments other than vehicles.

Referring now to the figures, FIG. 1 depicts an example of a system 100 for modeling apertures in additive manufacturing. The system includes a computing device 102 configured to generate a model of three-dimensional structure and transmit an output file 110 to an additive manufacturing apparatus.

The computing device 102 can take the form of a client device (e.g., a computing device that is actively operated by a user), a server, cloud computing device, or some other type of computational platform. In some examples, the computing device 102 can take the form of a desktop computer, laptop computer, tablet computer, smartphone, wearable computing device, or other type of device. The computing device 102 can be in communication with an additive manufacturing apparatus 114. As such, the computing device 102 can receive information from additive manufacturing apparatus 114 and/or transmit information to additive manufacturing apparatus 114. For example, the computing device 102 can transmit an instruction to additive manufacturing apparatus 114 to cause the additive manufacturing apparatus 114 to manufacture a substrate in accordance with a generated computational model of a three-dimensional structure, the generated computational model of the three-dimensional shown in FIGS. 3A-5 and described in further detail below.

The processor 104 can be a general-purpose processor or special purpose processor (e.g., a digital signal processor, application specific integrated circuit, etc.). The processor 104 is configured to execute the instructions 108 (e.g., computer-readable program instructions including computer executable code) that are stored in the memory 106 and are executable to provide various operations described herein. In alternative examples, the computing device 102 can include additional processors that are configured in the same manner. At least some of the operations described herein as being performed by the computing device 102 can be performed by the processor 104.

The memory 106 can take the form of one or more computer-readable storage media that can be read or accessed by the processor 104. The computer-readable storage media can include volatile and/or non-volatile storage components, such as optical, magnetic, organic or other memory or disc storage, which can be integrated in whole or in part with the processor 104. The memory 106 is considered non-transitory computer readable media. In some examples, the memory 106 can be implemented using a single physical device (e.g., one optical, magnetic, organic or other memory or disc storage unit), while in other examples, the memory 106 can be implemented using two or more physical devices.

The communication link can take the form of any wired connection (e.g., Ethernet) or wireless connection (e.g., Bluetooth®) over which computing device 102 and additive manufacturing apparatus 114 can engage in communication. For example, the computing device 102 can transmit an output file 110 to additive manufacturing apparatus 114.

In examples, the output file 110 can include instructions 112 for manufacturing a substrate in accordance with a computational model of a three-dimensional structure, as shown in FIGS. 3A-5. For instance, the additive manufacturing apparatus 114 can include a computing device 116 configured to read the output file 110 and instructions.

Generally, the additive manufacturing apparatus operates by manufacturing parts in a layer-wise construction of a plurality of layers of material. Additive manufacturing may involve applying liquid or powder material to a work area, and then performing a combination of sintering, curing, melting, and/or cutting to create a layer. The process is repeated up to several thousand times to construct a desired finished part or apparatus. The additive manufacturing apparatus may include components, such as a printing head or printer nozzle, control mechanisms (e.g., computing device), molds, etc., depending on a type of manufacturing being used. A range of processes finding industrial applications for additive manufacturing includes direct metal deposition, electron beam melting, polymer processes such as fused filament fabrication (FFF), fused deposition (FDM), Solid Ground Curing (SGC), Laminated Object Manufacturing (LOM), and select laser sintering (SLS) or selective laser melting (SLM), among others. The additive manufacturing apparatus may include components specific to any of these processes, or in some examples, the additive manufacturing apparatus may include hybrid machine tools to combine additive manufacturing with subtractive machining. The additive manufacturing machine may additionally include a laser metal powder bed where a laser melts down the metal powder in material layers (e.g., direct metal laser sintering, selective laser melting).

The substrate produced using the additive manufacturing apparatus is built up by laying down a layer of material on a build platform layer-by-layer. This process provides properties comparable to that of a casting.

The additive manufacturing material for manufacturing a substrate may include many types of materials, such as a polymer (e.g., polycarbonate, nylon, epoxy resin), a ceramic (silica or glass), and a metal (steel, titanium alloy, aluminum alloys, etc.), for example. The additive manufacturing material can be in many forms as well, such as powder, liquid, or a combination.

In some example embodiments, the computing device 116 of the additive manufacturing apparatus 114 is configured to receive the output file 110 and instructions 112 directly from the computing device 102 by way of a communication link, for example, as described above. Additionally, or alternatively, the output file 110 and instructions can be transmitted to the additive manufacturing apparatus 114 by way of a non-transitory computer readable medium.

Figure 2A:
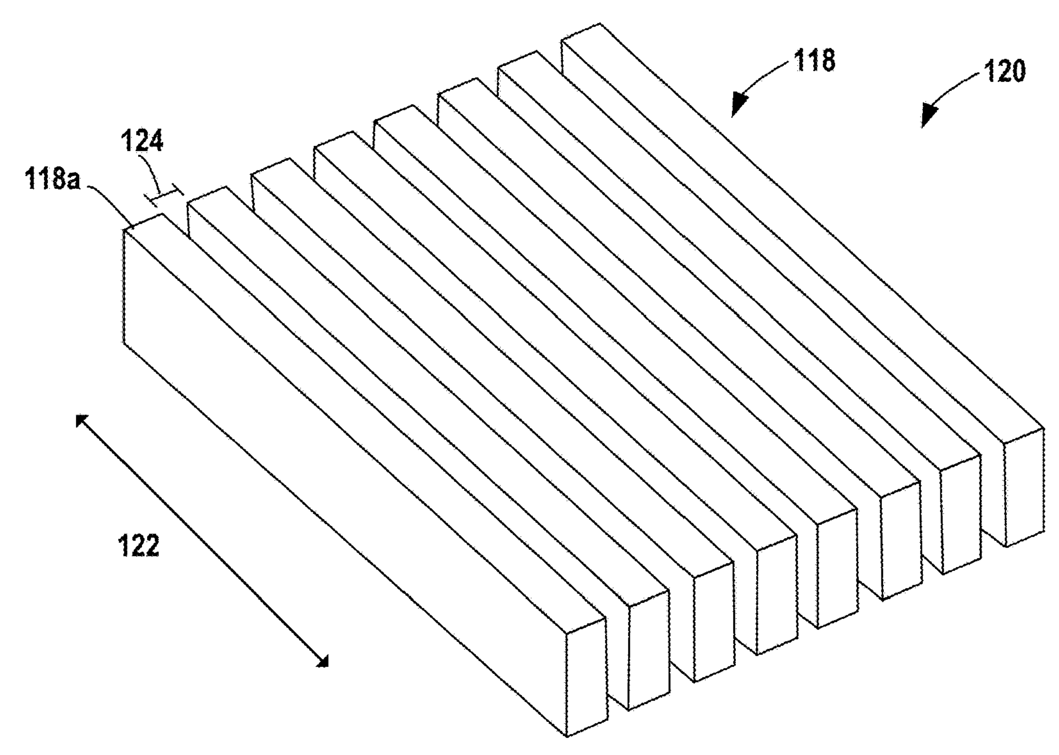
FIG. 2A depicts a perspective view of a portion of a computation model of a three-dimensional structure according to an example implementation.
Figure 2B:
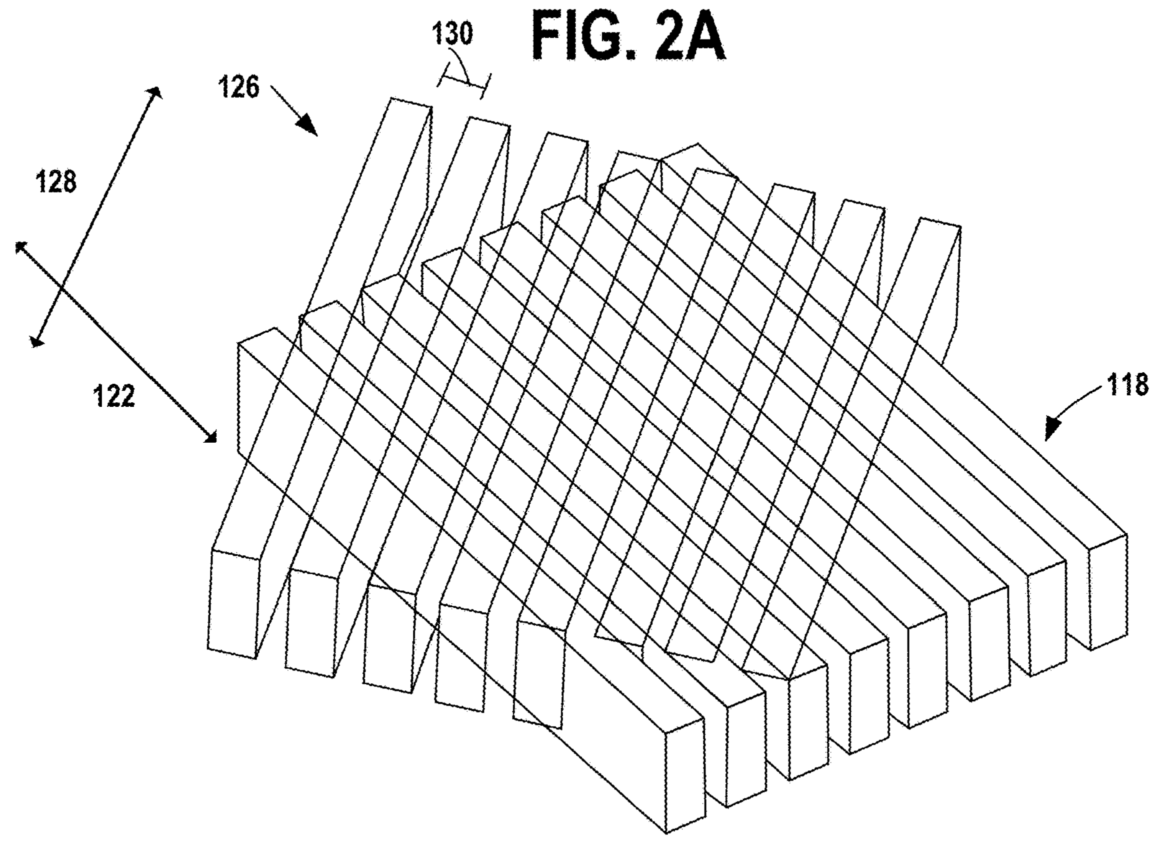
FIG. 2B depicts a perspective view of a portion a computation model of a three-dimensional structure according to an example implementation.

Now referring to FIGS. 2A-2B which illustrate initial steps of generating a computational model of a three-dimensional structure 120, according to an example embodiment. Developing a computational model involves generating a three-dimensional structure 120 of a first group of slats 118. Each slat (e.g., 118*a*) in the group of slats 118 can be generally rectangular prism shaped with sides extending along with a length, width, and a height. In example embodiments, the slat 118*a* is elongated in the length-wise direction such that the length of the slat 118*a* is substantially greater than the height and width of the slat 118*a*. Further, in examples, the height of the slat 118*a* may be greater than the width of the slat 118*a*.

An example three-dimensional structure 120 includes a first group of slats 118. Each of the slats in the first group of slats 118 is identical or substantially identical. Namely, each slat in the first group of slats 118 is an elongated rectangular prism, having the same length, height, and width as each other, with the length being substantially longer than the height or width of the rectangular prism.

Additionally, the slats are parallel, or substantially parallel to each other along a first axis 122 (i.e., the length-wise axis). Further, each slat in the first group of slats 118 has a gap with a distance 124 between the nearest neighboring slat. In some examples, this distance 124 is the same between each of the slats, although other examples are possible.

Now referring FIG. 2B, generating the computational model of the three-dimensional structure 120 involves generating a second group of slats 126. Each group of slats includes a plurality of slats which are parallel, or substantially parallel, along a second axis 128 in a length-wise direction. Additionally, in examples, each group (i.e., the first group of slats 118 and the second group of slats 126) has the same number of slats.

In some examples, the dimensions of each slat in the second group of slats 126 are the same as each slat in the first group of slats 118. Namely, the length, height, and width of each slat are the same in both groups of slats. In other examples, these dimensions of the slats may vary between the first group of slats 118 and the second group of slats 126. For example, the width of the slats in the second group of slats 126 may be greater than the width of the slats in the first group of slats 118.

Further, similar to the first group of slats 118, each slat in the second group of slats 126 has a gap having a distance 130 between the nearest neighboring slat. In some examples, this distance 124 is the same between each of the slats, although other examples are possible.

Further, in some examples, distance 124 and distance 130 are the same. Alternatively, in examples, distance 124 may be greater than or less than distance 130.

As shown in FIG. 2B, the second group of slats 126 intersects the first group of slats such that the second axis 128 intersects the first axis 122 at an angle. In some examples, the angle is between 30 degrees and 150 degrees. In other examples, the angle can be between 10 degrees and 170 degrees. Many examples are possible.

Further, while FIG. 2B illustrates a first group of slats 118 and a second group of slats 126, example three-dimensional structures can include any number of groups of slats. For example, a three-dimensional structure can include three groups of slats (as shown in FIGS. 3B and 4B) or more.

Figures 3A, 3B:
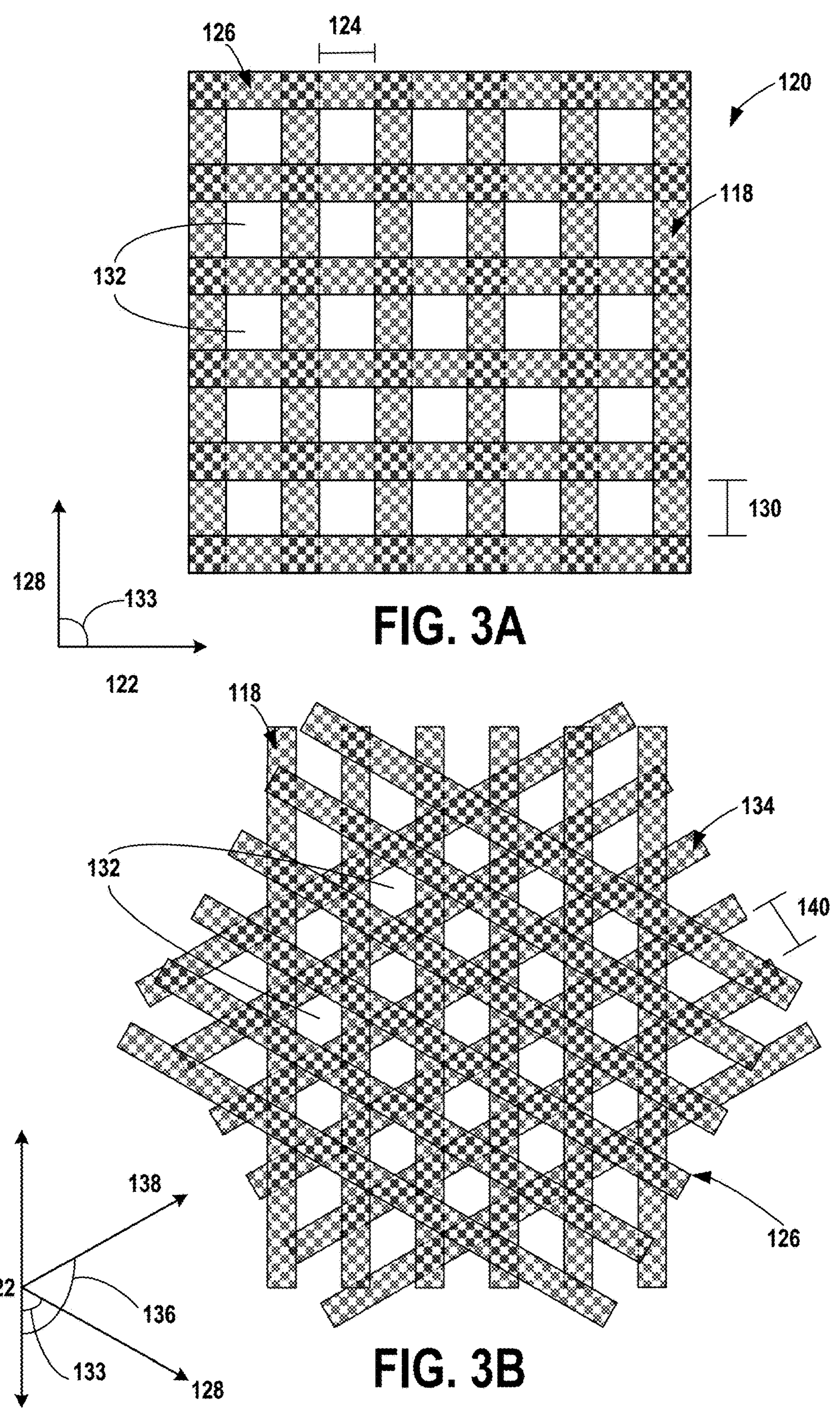
FIG. 3A depicts a top view of a three dimensional structure according to an example embodiment.
FIG. 3B depicts a top view of a computational model of a three dimensional structure according to an example embodiment.

Now referring to FIGS. 3A and 3B, a top view of a three dimensional structures according to an example embodiments.

FIG. 3A illustrates the first group of slats 118 intersecting the second group of slats 126 at angle 133. The example implementation shown in FIG. 3A shows the angle 133 being about 90 degrees, however many examples, are possible. As noted above, in some examples, the angle 133 between the first axis 122 and the second axis 128 is between 30 degrees and 150 degrees. In other examples, the angle 133 can be between 10 degrees and 170 degrees. Many examples are possible.

FIG. 3B illustrates a top view of an example three-dimensional structure 120 with a first group of slats 118, a second group of slats 126, and a third group of slats 134. The second group of slats 126 intersects the first group of slats at a first angle 133 with respect to the first axis 122 and the second axis 128. And the third group of slats 134 intersects the first group of slats 118 at a second angle 136, different than the first angle 133, with respect to the first axis 122 and a third axis 138, where the third axis 138 represents the length-wise axis of the third group of slats 134.

FIG. 3B illustrates the first angle 133 and the second angle 136 being approximately 60 degrees and 120 degrees, respectively, however many examples, are possible. As noted above, in some examples, the first angle 133 and second angle 136 can be between 30 degrees and 150 degrees. In other examples, the first angle 133 and second angle 136 can be between 10 degrees and 170 degrees.

As shown in FIGS. 3A and 3B, the gaps between slats create apertures 132 between the slats. Varying the dimensions of the slats (e.g., the width and length), the distances 124, 130, 140 between the slats, and the angle 133 of intersection of the first axis 122 and the second axis 128 creates different sizes and shapes of the apertures 132. Different sizes and shapes of the apertures 132 can be useful for various utilizations of the substrate generated in accordance with the computational model of the three-dimensional structure in practice, as discussed in more detail below.

As noted above, although the example embodiments shown in FIGS. 3A and 3B include two groups of slats and three groups of slats, respectively, example three-dimensional structures can include any number of groups of slats. For example, a three-dimensional structure can include four or more groups of slats.

Referring back to FIG. 1, once the model of the three-dimensional structure 120 is generated, the computing device 102 can then transmit the output file 110 to an additive manufacturing apparatus 114. The output file 110 includes instructions readable by the additive manufacturing apparatus 114 for manufacturing a substrate in accordance with the generated computation model of the three-dimensional structure.

Figure 4A:
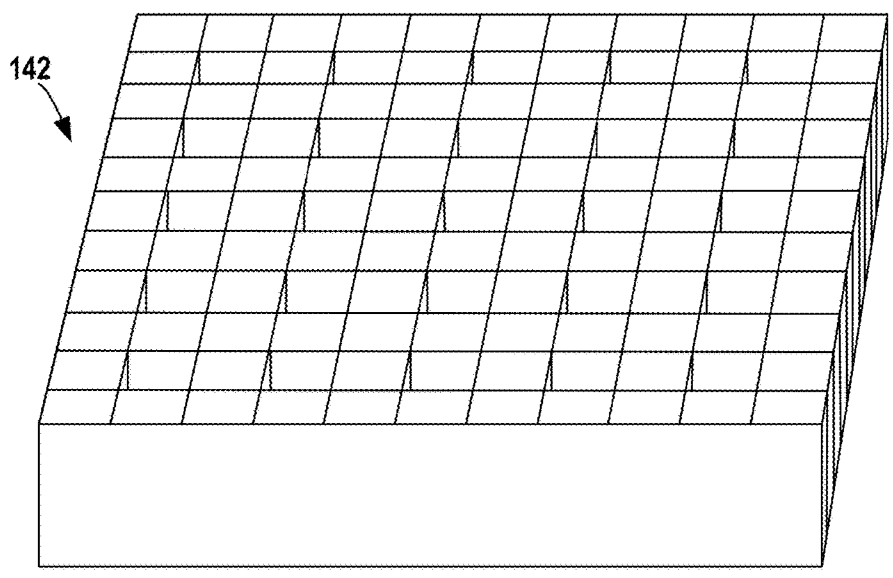
FIG. 4A depicts a perspective view of a substrate manufactured in accordance with the computational model of the three-dimensional structure according to an example embodiment.
Figure 4B:
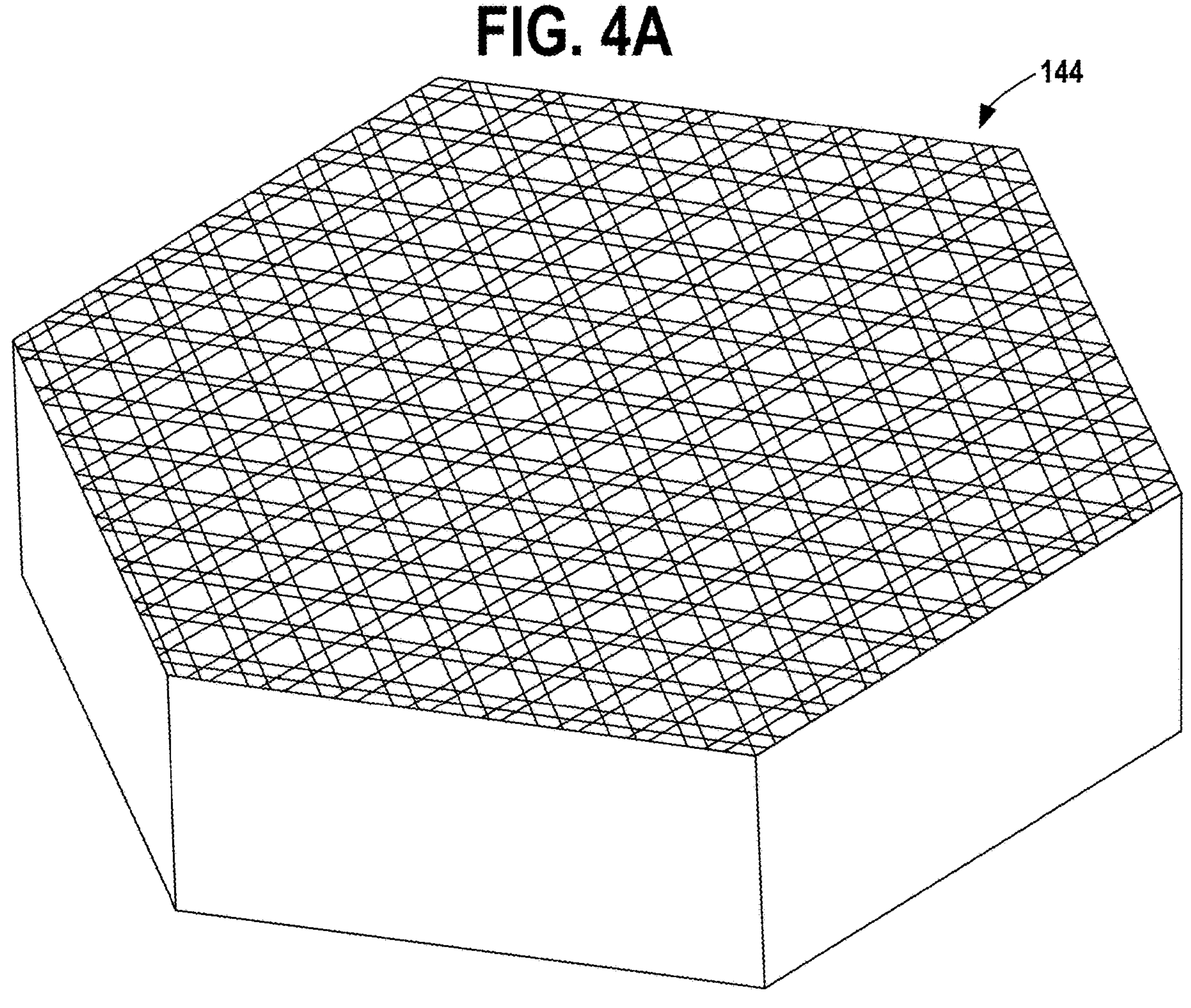
FIG. 4B depicts a perspective view of a substrate manufactured in accordance with the computational model of the three-dimensional structure according to an example embodiment.

FIGS. 4A and 4B illustrate example substrates 142, 144 generated by the additive manufacturing apparatus 114 and in accordance with the generated computational model of a the three-dimensional structure, according to example embodiments.

As shown in FIG. 4B, the example substrate 144 can be trimmed such that the substrate 144 forms a hexagonal prism. In some examples, the generating the computational model of the three dimensional structure involves trimming the edges of the structure to form a hexagonal prism. In other examples, the substrate may be manufactured by the additive manufacturing apparatus 114 and then trimmed to form the hexagonal prism.

As noted above, additive manufacturing apparatus 114 operates in a layer-wise construction of a plurality of layers of material. Although, the computational model of the three-dimensional includes overlapping areas (i.e., areas where the slats intersect one another), the computing device 116 of the additive manufacturing apparatus 114 does not distinguish overlapping areas. Rather, the additive manufacturing apparatus 114 only determines whether there is material or empty space for each layer. Accordingly, example systems and methods described herein eliminate the need to model perforations of substrate which, as noted above, can be computationally expensive, time consuming, and can cause machinery to shut down frequently.

Further, varying the dimensions of the slats, the distances between the slats, and the angle 133 of intersection of the first axis 122 and the second axis 128 creates different sizes and shapes of the apertures 132. Different sizes and shapes of the apertures 132 can be useful for various utilizations of the substrate in practice.

For instance, in examples where the substrate is utilized as an acoustic panel, larger apertures 132 may be desirable to provide a specific level of resistance to airflow into acoustic cell that resists and/or dampens a selected frequency (or frequencies) of acoustic energy. Meanwhile, the height of the slats may provide an inductive response that regulates mass flow of air into an acoustic cell. The aperture 132 within the acoustic cell may define capacitance (energy store) of the cell, and further may resist airflow. Thus, volumes of free space within the acoustic cell may considered and programmatically controlled to control the acoustic properties of the acoustic cell and control and/or dampen specific frequencies. This technique may be particularly helpful in scenarios where specific frequencies of noise, for example, from an aircraft engine, are perceptible to passengers of the aircraft and are known to cause discomfort of the passengers.

As noted above, the additive manufacturing material for manufacturing the substrate (e.g., 142, 144) may include many types of materials, such as a polymer (e.g., polycarbonate, nylon, epoxy resin), a ceramic (silica or glass), and a metal (steel, titanium alloy, aluminum alloys, etc.), for example. The additive manufacturing material can be in many forms as well, such as powder, liquid, or a combination.

Figure 5:
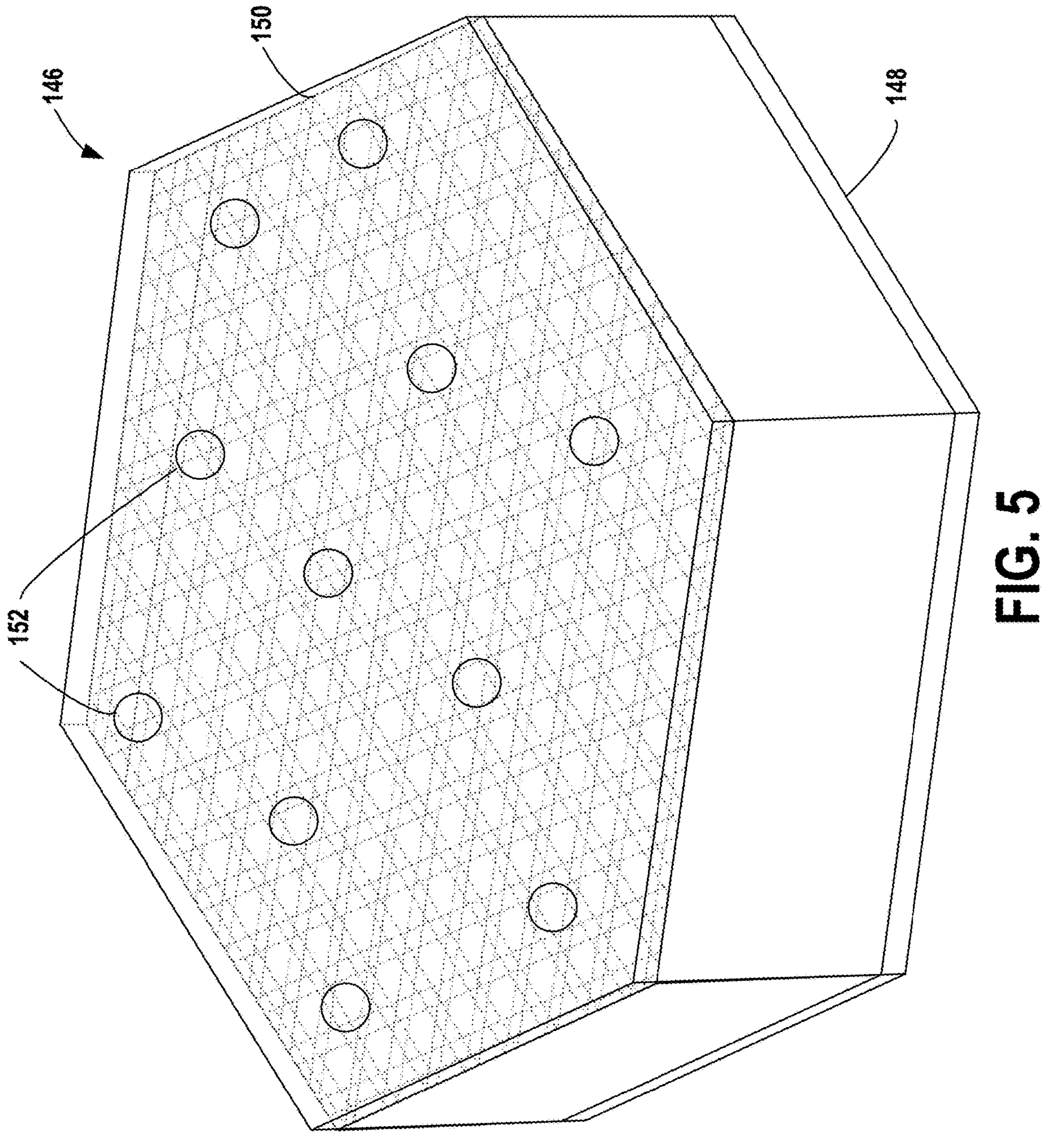
FIG. 5 depicts a substrate manufactured in accordance with the computational model of the three-dimensional structure according to an example embodiment.

FIG. 5 illustrates another example implementation of a substrate 146, according to an example embodiment. As shown in FIG. 5, in some examples, the substrate 146 includes a first planar sheet 148 coupled to the bottom portion of the slats and second planar sheet 150 coupled to the top portion of the slats. Within examples, the first planar sheet 148 and/or second planar sheet 150 can include apertures 152.

In examples where the substrate 146 includes the first planar sheet 148 and/or second planar sheet, the sheets 148, 150 can be generated with the computational model of the three-dimensional structure in any manner described above.

Various dimensions of the first planar sheet 148, second planar sheet 150, and apertures 152 can be desirable for different utilizations of the substrate. For instance, in examples where the substrate is utilized as an acoustic panel, larger apertures 152 may be desirable to provide a specific level of resistance to airflow into acoustic cell that resists and/or dampens a selected frequency (or frequencies) of acoustic energy. Meanwhile, the height of the first planar sheet 148 and second planar sheet 150 may provide an inductive response that regulates mass flow of air into an acoustic cell. The aperture 152 within the first planar sheet 148 and second planar sheet 150 may define capacitance (energy store) of the cell, and further may resist airflow. Thus, volumes of free space within the planar sheets 148, 150 may be considered and programmatically controlled to control the acoustic properties of the acoustic cell and control and/or dampen specific frequencies. This technique may be particularly helpful in scenarios where specific frequencies of noise, for example, from an aircraft engine, are perceptible to passengers of the aircraft and are known to cause discomfort of the passengers.

Figure 6:
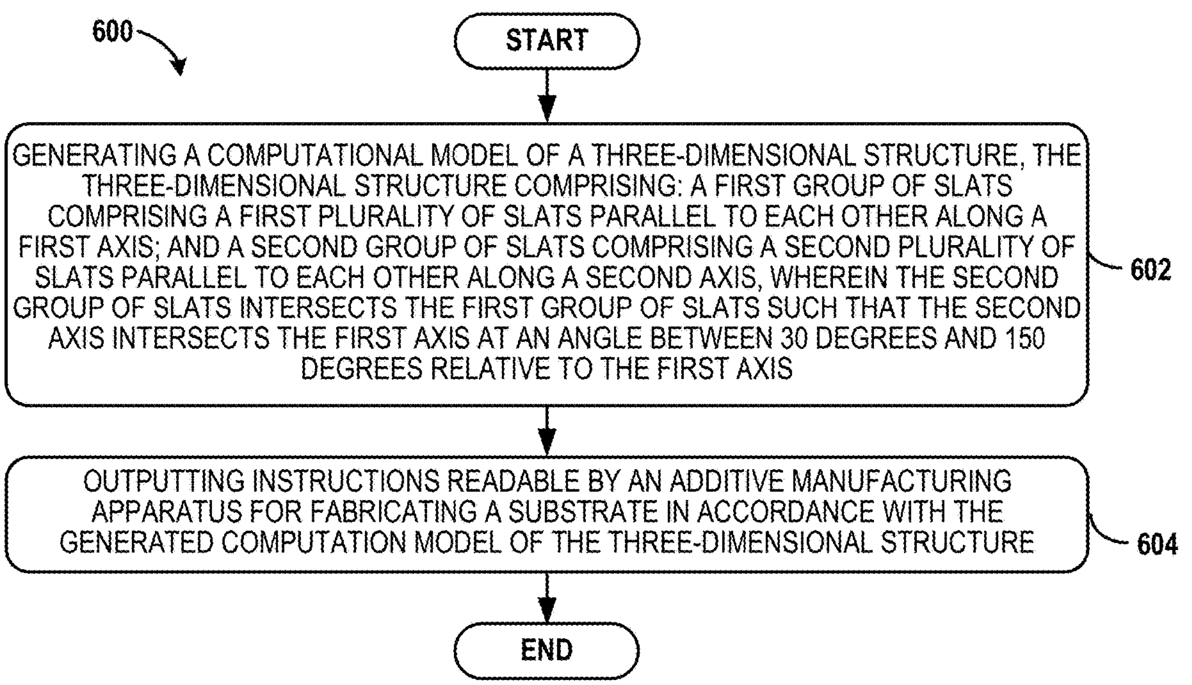
FIG. 6 shows a flowchart of an example method for generating computational model of a three-dimensional structure, according to an example implementation.

FIG. 6 shows a flowchart of an example of a method 600 that could be used with the systems for modeling apertures for additive manufacturing shown in FIGS. 1-5. Method 600 may include one or more operations, functions, or actions as illustrated by one or more of blocks 602-604.

At block 602, the method 600 includes generating a computational model of a three-dimensional structure. In examples, the three-dimensional structure includes a first group of slats comprising a first plurality of slats parallel to each other along a first axis. The three-dimensional structure further includes a second group of slats comprising a second plurality of slats parallel to each other along a second axis, wherein the second group of slats intersects the first group of slats such that the second axis intersects the first axis at an angle between 30 degrees and 150 degrees relative to the first axis.

In some example implementations, generating the first group of slats comprises generating each of the first plurality of the first group of slats with a first height perpendicular to the first axis, wherein generating the second group of slats comprises generating each of the second plurality of slats with a second height perpendicular to the second axis, and wherein the first height and the second height are equal.

Further, in some example implementations, the angle is a first angle, and generating the computational model of the three-dimensional structure further comprises generating a third group of slats comprising a third plurality of slats substantially parallel to each other along a third axis, and wherein the third group of slats intersects the first group of slats and the second group of slats such that the third axis intersects first axis at a second angle different than the first angle.

Additionally, in some example implementations, generating a computational model of a three-dimensional structure further includes generating a first gap between each slat of the first plurality of slats, and generating the second group of slats includes generating a second gap between each of slat of the second plurality of slats. In these examples, the first gap and the second gap are equal and the intersections of each first gap between each of the first plurality of slats with each second gap between each of the second plurality of slats define a plurality of apertures in the three-dimensional structure. The first group of slats aligned with a first axis and second group of slats aligned with a second axis define prism-shaped apertures, where the second group of slats intersects the first group of slats with the second axis intersecting the first axis at an angle between 30 degrees and 150 degrees relative to the first axis, such that the intersection of each first gap with each second gap may create rhombus-shaped or diamond-shaped apertures. Where the three-dimensional structure further comprises a third plurality of slats substantially parallel to each other along a third axis with a third gap between each of slat of the third plurality of slats, and the first axis, second axis and third axis each intersect each other at an angle, the intersections of each first gap, each second gap and each third gap may define hexagon-shaped apertures as shown in FIG. 3B.

In example embodiments, generating a computational model of a three-dimensional structure includes generating a first planar sheet coupled to a bottom portion of the first group of slats and a bottom portion of the second group of slats, the first planar sheet comprising a first plurality of apertures. In examples, generating a computational model of a three-dimensional structure also includes generating a second planar sheet coupled to a top portion of the first group of slats and a top portion of the second group of slats, the second planar sheet comprising a second plurality of apertures.

At block 604, the method 600 includes outputting instructions readable by an additive manufacturing apparatus for fabricating a substrate in accordance with the generated computation model of the three-dimensional structure.

In example implementations, the method 600 further includes manufacturing the substrate in accordance with the generated computation model of the three-dimensional structure. Further, in example implementations, the manufacturing the substrate in accordance with the generated computation model of the three-dimensional structure includes fabricating a septum of a cell of an acoustic panel.

Devices or systems may be used or configured to perform logical functions presented in FIGS. 1-6. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions, such as when operated in a specific manner. Although blocks in FIG. 6, are illustrated in a sequential order, these blocks may also be performed in parallel, and/or in a different order than those described herein. Also, the various blocks may be combined into fewer blocks, divided into additional blocks, and/or removed based upon the desired implementation.

It should be understood that for these and other processes and methods disclosed herein, flowcharts show functionality and operation of one possible implementation of present examples. In this regard, each block or portions of each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. Further, the program code can be encoded on a computer-readable storage media in a machine-readable format, or on other non-transitory media or articles of manufacture. The computer readable medium may include non-transitory computer readable medium or memory, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block or portions of each block in FIG. 6 may represent circuitry that is wired to perform the specific logical functions in the process. Alternative implementations are included within the scope of the examples of the present disclosure in which functions may be executed out of order from that shown or discussed, including substantially concurrent or in reverse order, depending on the functionality involved, as would be understood by those reasonably skilled in the art.

Different examples of the system(s), device(s), and method(s) disclosed herein include a variety of components, features, and functionalities. It should be understood that the various examples of the system(s), device(s), and method(s) disclosed herein may include any of the components, features, and functionalities of any of the other examples of the system(s), device(s), and method(s) disclosed herein in any combination or any sub-combination, and all of such possibilities are intended to be within the scope of the disclosure.

The description of the different advantageous arrangements has been presented for purposes of illustration and description, and is not intended to be exhaustive or limited to the examples in the form disclosed. Many modifications and variations will be apparent to those of ordinary skill in the art. Further, different advantageous examples may describe different advantages as compared to other advantageous examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. A system comprising:

a computing device comprising a processor, the processor configured to carry out operations, the operations comprising:

generating a computational model of a three-dimensional structure, the three-dimensional structure comprising:

a first group of slats comprising a first plurality of slats substantially parallel to each other along a first axis; and a second group of slats comprising a second plurality of slats substantially parallel to each other along a second axis, wherein the second group of slats intersects the first group of slats such that the second axis intersects the first axis at an angle between 30 degrees and 150 degrees relative to the first axis; and outputting instructions for manufacturing a substrate in accordance with the generated computation model of the three-dimensional structure; and an additive manufacturing apparatus communicatively coupled to the computing device and configured to receive the instructions and manufacture the substrate in accordance with the generated computation model of the three-dimensional structure, wherein the generated computational model of the three-dimensional structure includes overlapping areas where the first group of slats intersect with the second group of slats, wherein the additive manufacturing apparatus determines from the computational model for each layer to be deposited, whether there is material or empty space, wherein the additive manufacturing apparatus does not distinguish overlapping areas from the computational model, and wherein the computational model does not model a substrate having individual perforations without overlapping slats.

2. The system of claim 1, wherein generating the computational model comprises generating each of the first plurality of the first group of slats with a first height perpendicular to the first axis, wherein generating the computational model comprises generating each of the second plurality of slats with a second height perpendicular to the second axis, and wherein the first height and the second height are equal.

3. The system of claim 1, wherein generating the computational model of the three-dimensional structure further comprises generating a third group of slats comprising a third plurality of slats substantially parallel to each other along a third axis, and wherein the third group of slats intersects the first group of slats and the second group of slats such that the third axis intersects the first axis at a second angle, different than the first angle.

4. The system of claim 3, wherein the first group of slats has a first height perpendicular to the first axis, the second group of slats has a second height perpendicular to the second axis, and the third group of slats has a third height perpendicular to the third axis, and wherein the first height, the second height, and the third height are equal.

5. The system of claim 1, wherein the substrate comprises a septum of a cell of an acoustic panel.

6. The system of claim 1, wherein generating the computational model comprises generating a first gap between each slat of the first plurality of slats, and generating the computational model comprises generating a second gap between each slat of the second plurality of slats.

7. The system of claim 6, wherein the first gap and the second gap are equal and the intersections of each first gap between each of the first plurality of slats with each second gap between each of the second plurality of slats define a plurality of apertures in the three-dimensional structure.

8. The system of claim 7, wherein the three-dimensional structure comprises a plurality of apertures that are generally prism-shaped, the apertures being identical to each other.

9. The system of claim 1, wherein generating the computational model of the three-dimensional structure further comprises generating:

a first planar sheet coupled to a bottom portion of the first group of slats and a bottom portion of the second group of slats, the first planar sheet comprising a first plurality of apertures; and a second planar sheet coupled to a top portion of the first group of slats and a top portion of the second group of slats, the second planar sheet comprising a second plurality of apertures.

10. A method comprising:

generating a computational model of a three-dimensional structure, the three-dimensional structure comprising:

a first group of slats comprising a first plurality of slats parallel to each other along a first axis; and a second group of slats comprising a second plurality of slats parallel to each other along a second axis, wherein the second group of slats intersects the first group of slats such that the second axis intersects the first axis at an angle between 30 degrees and 150 degrees relative to the first axis; and outputting instructions readable by an additive manufacturing apparatus for fabricating a substrate in accordance with the generated computation model of the three-dimensional structure, wherein the computational model of the three-dimensional structure includes overlapping areas where the first group of slats intersect with the second group of slats; and determining by the additive manufacturing apparatus, from the computational model for each layer to be deposited, whether there is material or empty space, wherein the additive manufacturing apparatus does not distinguish overlapping areas from the computational model, and wherein the computational model does not model a substrate having individual perforations without overlapping slats.

11. The method according to claim 10, further comprising:

manufacturing the substrate in accordance with the generated computation model of the three-dimensional structure.

12. The method according to claim 11, wherein manufacturing the substrate in accordance with the generated computation model of the three-dimensional structure comprises fabricating a septum of a cell of an acoustic panel.

13. The method according to claim 10, wherein generating the first group of slats comprises generating each of the first plurality of the first group of slats with a first height perpendicular to the first axis, wherein generating the second group of slats comprises generating each of the second plurality of slats with a second height perpendicular to the second axis, and wherein the first height and the second height are equal.

14. The method according to claim 10, wherein the angle is a first angle, wherein generating the computational model of the three-dimensional structure further comprises generating a third group of slats comprising a third plurality of slats substantially parallel to each other along a third axis, and wherein the third group of slats intersects the first group of slats and the second group of slats such that the third axis intersects first axis at a second angle different than the first angle.

15. The method of claim 10, wherein generating a computational model of a three-dimensional structure further comprises generating a first gap between each slat of the first plurality of slats, and generating the second group of slats comprises generating a second gap between each slat of the second plurality of slats, wherein the first gap and the second gap are equal and the intersections of each first gap between each of the first plurality of slats with each second gap between each of the second plurality of slats define a plurality of apertures in the three-dimensional structure.

16. The method according to claim 10, wherein generating a computational model of a three-dimensional structure, further comprises generating:

a first planar sheet coupled to a bottom portion of the first group of slats and a bottom portion of the second group of slats, the first planar sheet comprising a first plurality of apertures; and a second planar sheet coupled to a top portion of the first group of slats and a top portion of the second group of slats, the second planar sheet comprising a second plurality of apertures.

17. A non-transitory computer-readable media storing instructions executable by one or more signal processors, wherein the instructions, when executed, cause the one or more signal processors to perform functions comprising:

generating a computational model of a three-dimensional structure, the three-dimensional structure comprising:

a first group of slats comprising a first plurality of slats parallel to each other along a first axis; and a second group of slats comprising a second plurality of slats parallel to each other along a second axis, wherein the second group of slats intersects the first group of slats such that the second axis intersects the first axis at an angle between 30 degrees and 150 degrees relative to the first axis;

outputting instructions readable by an additive manufacturing apparatus for fabricating a substrate in accordance with the generated computation model of the three-dimensional structure, wherein the computational model of the three-dimensional structure includes overlapping areas where the first group of slats intersect with the second group of slats; and determining by the additive manufacturing apparatus, from the computational model for each layer to be deposited, whether there is material or empty space, wherein the additive manufacturing apparatus does not distinguish overlapping areas from the computational model, and wherein the computational model does not model a substrate having individual perforations without overlapping slat.

18. The non-transitory computer-readable media according to claim 17, wherein the functions further comprise:

transmitting the instructions to an additive manufacturing apparatus communicatively coupled to the processor.

19. The non-transitory computer-readable media according to claim 17, wherein the angle is a first angle, wherein generating the computational model of the three-dimensional structure further comprises generating:

a third group of slats comprising a third plurality of slats substantially parallel to each other along a third axis, and wherein the third group of slats intersects the first group of slats and the second group of slats such that the third axis intersects the first axis at a second angle different than the first angle.

20. The non-transitory computer-readable media according to claim 17, wherein generating a computational model of a three-dimensional structure, further comprises generating:

a first planar sheet coupled to a bottom portion of the first group of slats and a bottom portion of the second group of slats, the first planar sheet comprising a first plurality of apertures; and a second planar sheet coupled to a top portion of the first group of slats and a top portion of the second group of slats, the second planar sheet comprising a second plurality of apertures.

* * * * *